United States Patent
Lin et al.

(10) Patent No.: US 10,418,537 B1
(45) Date of Patent: Sep. 17, 2019

(54) HIGH-POWER REMOTE PHOSPHOR WHITE LED HEAT-DISSIPATION PACKAGE

(71) Applicant: XUYU OPTOELECTRONICS (SHENZHEN) CO., LTD., Shenzhen (CN)

(72) Inventors: Jintian Lin, Shenzhen (CN); Xiaobing Cao, Shenzhen (CN)

(73) Assignee: XUYU OPTOELECTRONICS (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 16/395,108

(22) Filed: Apr. 25, 2019

(30) Foreign Application Priority Data

Feb. 14, 2019  (CN) .......................... 2019 1 0113831

(51) Int. Cl.
*H01L 33/64*   (2010.01)
*H01L 33/50*   (2010.01)
*H01L 33/60*   (2010.01)
*H01L 33/58*   (2010.01)

(52) U.S. Cl.
CPC .......... *H01L 33/642* (2013.01); *H01L 33/505* (2013.01); *H01L 33/507* (2013.01); *H01L 33/58* (2013.01); *H01L 33/60* (2013.01); *H01L 33/641* (2013.01)

(58) Field of Classification Search
CPC ...... H01L 33/642; H01L 33/507; H01L 33/58
See application file for complete search history.

(56) References Cited

U.S. PATENT DOCUMENTS

| 2009/0267093 | A1* | 10/2009 | Kamada ................. H01L 33/483 257/98 |
| 2011/0068356 | A1* | 3/2011 | Chiang .................. H01L 33/507 257/98 |
| 2013/0293097 | A1* | 11/2013 | Bergenek ............... H05B 33/02 313/512 |

FOREIGN PATENT DOCUMENTS

| CN | 201201304 Y | * | 3/2009 | |
| CN | 207250550 U | * | 4/2018 | |
| WO | WO-2010104276 A2 | * | 9/2010 | ........... H01L 33/486 |

* cited by examiner

*Primary Examiner* — Charles D Garber
*Assistant Examiner* — Alia Sabur
(74) *Attorney, Agent, or Firm* — Getech Law LLC; Jun Ye

(57) ABSTRACT

High-power remote phosphor white LED heat-dissipation package relates to an LED heat-dissipation package, for solving the problem of poor heat dissipation of LED package structures. The substrate of the package structure is provided with a boss and a heat conducting ring, and the phosphor structural layer contains hollow glass microspheres. The white LED heat-dissipation package structure in the present invention improves the spatial chroma uniformity of the white light by using the hollow glass microspheres, thereby reducing the costs. The package structure can improve the heat dissipation efficiency of the chip and the utilization ratio of light emitted from the chip. The present invention is applicable to prepare high-power remote phosphor white LEDs.

10 Claims, 3 Drawing Sheets

HIGH-POWER REMOTE PHOSPHOR WHITE LED HEAT-DISSIPATION PACKAGE

High-power remote phosphor white LED heat-dissipation package relates to an LED heat-dissipation package, for solving the problem of poor heat dissipation of LED package structures. The substrate of the package structure is provided with a boss and a heat conducting ring, and the phosphor structural layer of the package structure contains hollow glass microspheres. The white LED heat-dissipation package structure in the present invention improves the spatial chroma uniformity of the white light by using the hollow glass microspheres, thereby reducing the costs. The package structure can improve the heat dissipation efficiency of the chip and a fluorescent layer and the utilization ratio of light emitted from the chip. The present invention is applicable to prepare high-power remote phosphor white LEDs.

TECHNICAL FIELD

The present invention relates to an LED heat-dissipation package.

BACKGROUND

The principle of illumination of the phosphor-converted white LED package is: coating a surface of an LED chip with a layer of phosphors, exciting the phosphors with the light emitted from the chip to generate light of other colors, and mixing with the light emitted from the chip to generate white light. According to the remote phosphor white LED package, the space between the phosphors and the LED chip is filled with a certain thickness of packaging adhesive, and the phosphors and the LED chip are separated by the packaging adhesive, thereby increasing the distance between the phosphors and the chip, and improving the luminous efficiency of lamps.

The existing lamp adopting the LED package has the advantages of energy saving and high efficiency, but the light conversion efficiency of the LED chip in the LED package is about 20%-30%, and the remaining energy is converted into internal energy, which causes increase in chip temperature, and the increase in chip temperature results in a shortened service life of the packaging adhesive in direct contact with it or even carbonize the packaging adhesive, affecting the service life of the LED package. In the existing LED package, the heat dissipation of the LED chip and the heat dissipation of the phosphor layer are both completed by a base, and the LED chip and the phosphor layer are mutually heated. Moreover, in the existing LED package, the bases are generally flat, and the flat bases have a small heating area, and thus the heat dissipation performance is poor. In summary, the existing LED package has the problem of poor heat dissipation.

SUMMARY

To solve the problem of poor heat dissipation of the existing LED package, the present invention provides a high-power remote phosphor white LED heat-dissipation package.

The high-power remote phosphor white LED heat-dissipation package according to the present invention includes a substrate (1), a chip (2), a heat conducting ring (3), a condenser lens (5), a support lens (6), and a phosphor structural layer (7).

An upper surface of the substrate (1) is provided with a cylindrical boss (11), the center of an upper surface of the boss (11) is provided with an inverted cone-shaped blind hole (12), and an inner wall of the blind hole (12) is a reflective surface; the heat conducting ring (3) is annular, and an annular protrusion (31) is provided on an upper surface of the heat conducting ring (3) near an inner circumferential surface; the outer circumferential diameter of the annular protrusion (31) decreases progressively from bottom to top, and the inner circumferential surface of the annular protrusion (31) is an inclined reflective surface; an annular groove (33) concentric with the annular protrusion (31) is disposed outside the annular protrusion (31) on the upper surface of the heat conducting ring (3); the chip (2) is mounted at the bottom of the inverted cone-shaped blind hole (12) in the substrate (1), the blind hole (12) is filled with a packaging adhesive (4), and the heat conducting ring (3) is sleeved on the boss (11) disposed on the upper surface of the substrate (1); the condenser lens (5) is a hemispherical lens, and a flat side of the condenser lens (5) faces towards the blind hole (12) and covers an opening of the blind hole (12); an upper surface of the condenser lens (5) between inclined reflective surfaces of the heat conducting ring (3) is coated with the phosphor structural layer (7); and the support lens (6) is a hollow hemispherical lens, the support lens (6) is sleeved on the phosphor structural layer (7), and an opening of the support lens (6) is embedded inside the annular groove (33).

The phosphor structural layer (7) is formed by mixing hollow glass microspheres with phosphors attached to the surfaces thereof and silica gel, where the volume fraction of the hollow glass microspheres attached with the phosphors is 60%-65%.

The principle and beneficial effects of the present invention are as follows:

1. In the present invention, phosphors are attached to the surfaces of the hollow glass microspheres to obtain a phosphor structural layer (7) containing the hollow glass microspheres with phosphors attached to the surfaces thereof, the hollow glass microspheres are characterized by perfect spherical surfaces and highly transparency, white light generated by the excitation of phosphors on the rear side of a light exiting surface of the phosphor structural layer (7) can be transmitted to the light exiting surface through the hollow glass microspheres, and by combining the hollow glass microspheres with the phosphors attached to multiple surfaces thereof in the phosphor structural layer (7), superimposed white light can be generated on the light exiting surface of the phosphor structural layer (7), thereby improving the spatial chroma uniformity of the white light and avoiding the occurrence of abnormalities such as scattered light, yellow spots or blue center; moreover, the hollow glass microspheres have perfect spherical surfaces and can generate multi-angle exit light when the light is incident, to make the light more uniform, and have replaced a light diffusing agent.

The existing phosphor layer is generally prepared by mixing phosphors into an epoxy resin or silica gel to prepare a fluorescent glue, and finally coating the surface of the packaging adhesive with the fluorescent glue, and since the proportion of the epoxy resin or silica gel in the fluorescent glue is relatively high, the aging probability and costs of the epoxy resin or silica gel are improved. In the present invention, the silica gel in the phosphor structural layer (7) is used as a bonding material, and is filled with hollow glass microspheres, thereby reducing the usage amount of silica gel, which is only 35%-40% of the usage amount of silica gel in the existing LED package, and thus the costs can also be reduced. The high heat insulation performance of the hollow glass microspheres can also reduce the effect of phosphor heating on the surrounding silica gel.

2. In the present invention, a heat dissipation path of the phosphor layer and a heat dissipation path of the chip are respectively provided, where the substrate (1) dissipates heat of the chip (2), and the heat conducting ring (3) dissipates heat of the phosphor structural layer (7), and the annular protrusion (31) of the heat conducting ring (3) is in contact with the phosphor structural layer (7) for transferring heat. Since the opening of the support lens (6) is embedded inside the annular groove (33), the annular protrusion (31) and an upper surface of the phosphor structural layer (7) form a cavity structure with the inner surface of the support lens (6), and the heat generated by the phosphor structural layer (7) can be transmitted to the upper surface of the annular protrusion (31) through the cavity structure for heat absorption and dissipation. The outer circumferential surface of the heat conducting ring (3) is exposed outside the support lens (6) and is in contact with the atmosphere to facilitate heat dissipation of the phosphor structural layer (7), and the blind hole (12) in the substrate (1) can increase the heating area of the base, thereby improving the heat dissipation efficiency of the chip (2).

3. In the present invention, the condenser lens (5) and the packaging adhesive (4) with which the blind hole (12) is filled can block the heat conduction between the phosphor structural layer (7) and the chip (2), and the white light generated by the phosphor structural layer (7) is refracted by the condenser lens (5) and irradiates around the chip (2), thereby avoiding the radiant heat generation of the phosphor structural layer (7) on the chip (2).

4. The reflective surface of the inner wall of the blind hole (12), the inclined reflective surfaces of the annular protrusion (31) in the heat conducting ring (3), and the condenser lens (5) can gather light emitted from the chip (2) on the phosphor structural layer (7), which can improve the utilization rate of light emitted from the chip (2).

DESCRIPTION OF EMBODIMENTS

The technical solutions in the present invention are not limited to the specific embodiments listed below, and also include any suitable combination of the specific embodiments.

Figure 1:
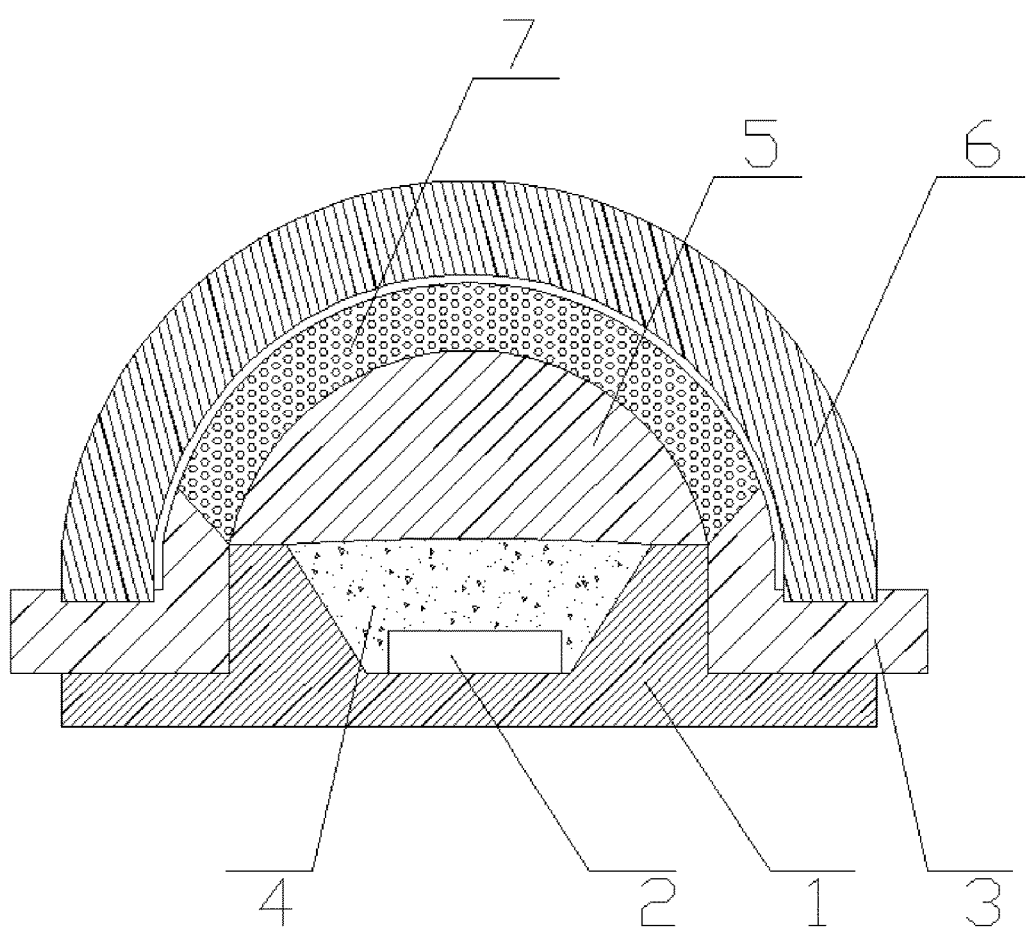
FIG. 1 is a schematic structural diagram of a high-power remote phosphor white LED heat-dissipation package according to the present invention.
Figure 2:
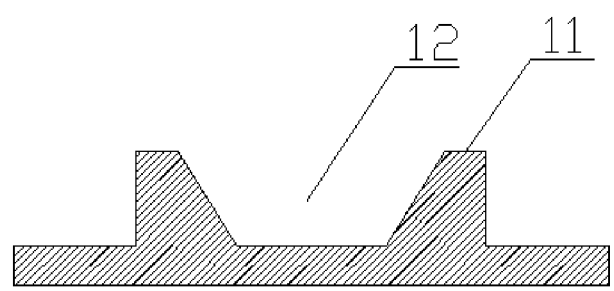
FIG. 2 is a schematic structural diagram of a substrate (1)
Figure 3:
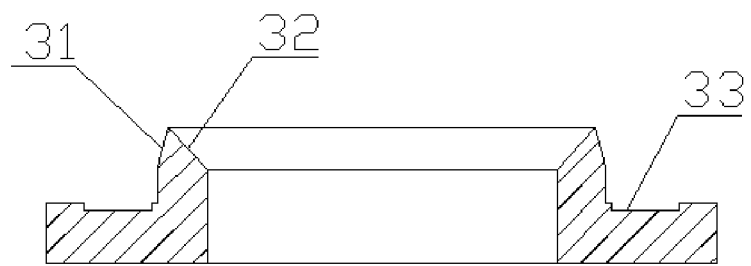
FIG. 3 is a schematic structural diagram of a heat conducting ring (3).

Embodiment I: this embodiment is illustrated with reference to FIG. 1 to FIG. 3, and a high-power remote phosphor white LED heat-dissipation package of this embodiment includes a substrate (1), a chip (2), a heat conducting ring (3), a condenser lens (5), a support lens (6), and a phosphor structural layer (7).

An upper surface of the substrate (1) is provided with a cylindrical boss (11), the center of an upper surface of the boss (11) is provided with an inverted cone-shaped blind hole (12), and an inner wall of the blind hole (12) is a reflective surface; the heat conducting ring (3) is annular, and an annular protrusion (31) is provided on an upper surface of the heat conducting ring (3) near an inner circumferential surface; the outer circumferential diameter of the annular protrusion (31) decreases progressively from bottom to top, and the inner circumferential surface of the annular protrusion (31) is an inclined reflective surface; an annular groove (33) concentric with the annular protrusion (31) is disposed outside the annular protrusion (31) on the upper surface of the heat conducting ring (3); the chip (2) is mounted at the bottom of the inverted cone-shaped blind hole (12) in the substrate (1), the blind hole (12) is filled with a packaging adhesive (4), and the heat conducting ring (3) is sleeved on the boss (11) disposed on the upper surface of the substrate (1); the condenser lens (5) is a hemispherical lens, and a flat side of the condenser lens (5) faces towards the blind hole (12) and covers an opening of the blind hole (12); an upper surface of the condenser lens (5) between inclined reflective surfaces of the heat conducting ring (3) is coated with the phosphor structural layer (7); and the support lens (6) is a hollow hemispherical lens, the support lens (6) is sleeved on the phosphor structural layer (7), an opening of the support lens (6) is embedded inside the annular groove (33).

The phosphor structural layer (7) is formed by mixing hollow glass microspheres with phosphors attached to the surfaces thereof and silica gel, where the volume fraction of the hollow glass microspheres attached with the phosphors is 60%-65%.

This embodiment has the following beneficial effects:

1. In this embodiment, phosphors are attached to the surfaces of the hollow glass microspheres to obtain a phosphor structural layer (7) containing the hollow glass microspheres with phosphors attached to the surfaces thereof, the hollow glass microspheres are characterized by perfect spherical surfaces and highly transparency, and white light generated by the excitation of phosphors on the rear side of a light exiting surface of the phosphor structural layer (7) can be transmitted to the light exiting surface through the hollow glass microspheres, and by combining the hollow glass microspheres with the phosphors attached to multiple surfaces thereof in the phosphor structural layer (7), superimposed white light can be generated on the light exiting surface of the phosphor structural layer (7), thereby improving the spatial chroma uniformity of the white light and avoiding the occurrence of abnormalities such as scattered light, yellow spots or blue center; moreover, the hollow glass microspheres have perfect spherical surfaces and can generate multi-angle exit light when the light is incident, to make the light more uniform, and have replaced a light diffusing agent.

The existing phosphor layer is generally prepared by mixing phosphors into an epoxy resin or silica gel to prepare a fluorescent glue, and finally coating the surface of the packaging adhesive with the fluorescent glue, and since the proportion of the epoxy resin or silica gel in the fluorescent glue is relatively high, the aging probability and cost of the epoxy resin or silica gel are improved. In this embodiment, the silica gel in the phosphor structural layer (7) is used as a bonding material, and is filled with hollow glass microspheres, thereby reducing the usage amount of silica gel, which is only 35%-40% of the usage amount of silica gel in the existing LED package, and thus the costs can also be reduced. The high heat insulation performance of the hollow glass microspheres can also reduce the effect of phosphor heating on the surrounding silica gel.

2. This embodiment provides a heat dissipation path of the phosphor layer and a heat dissipation path of the chip, respectively, where the substrate (1) dissipates heat of the chip (2), and the heat conducting ring (3) dissipates heat of the phosphor structural layer (7), and the annular protrusion (31) of the heat conducting ring (3) is in contact with the phosphor structural layer (7) for transferring heat. Since the opening of the support lens (6) is embedded inside the annular groove (33), the annular protrusion (31) and an upper surface of the phosphor structural layer (7) form a cavity structure with the inner surface of the support lens (6), and the heat generated by the phosphor structural layer (7) can be transmitted to the upper surface of the annular protrusion (31) through the cavity structure for heat absorption and dissipation. The outer circumferential surface of the heat conducting ring (3) is exposed outside the support lens (6) and is in contact with the atmosphere to facilitate heat dissipation of the phosphor structural layer (7), and the blind hole (12) in the substrate (1) can increase the heating area of the base, thereby improving the heat dissipation efficiency of the chip (2).

3. In this embodiment, the condenser lens (5) and the packaging adhesive (4) with which the blind hole (12) is filled can block the heat conduction between the phosphor structural layer (7) and the chip (2), and the white light generated by the phosphor structural layer (7) is refracted by the condenser lens (5) and irradiates around the chip (2), thereby avoiding the radiant heat generation of the phosphor structural layer (7) on the chip (2).

4. The reflective surface of the inner wall of the blind hole (12), the inclined reflective surfaces of the annular protrusion (31) in the heat conducting ring (3), and the condenser lens (5) can gather light emitted from the chip (2) on the phosphor structural layer (7), which can improve the utilization rate of light emitted from the chip (2).

Embodiment II: this embodiment differs from Embodiment I in that the reflective surface of the inner wall of the blind hole (12) and the inclined reflective surfaces of the annular protrusion (31) in the heat conducting ring (3) are obtained by polishing or coating a reflective coating, or the reflective surface of the inner wall of the blind hole (12) and the inclined reflective surfaces of the annular protrusion (31) in the heat conducting ring (3) are coated with a nickel layer or a silver layer. Other steps and parameters are the same as those in Embodiment I.

Embodiment III: this embodiment differs from Embodiment I or II in that the packaging adhesive (4) is silica gel. Other steps and parameters are the same as those in Embodiment I or II.

Embodiment IV: this embodiment differs from one of Embodiments I to III in that the substrate (1) is an MCPCB aluminum substrate. Other steps and parameters are the same as those in one of Embodiments I to III.

Embodiment V: this embodiment differs from one of Embodiments I to IV in that the material of the heat conducting ring (3) is pure copper or aluminum alloy. Other steps and parameters are the same as those in one of Embodiments I to IV.

Embodiment VI: this embodiment differs from Embodiment V in that the aluminum alloy is Al—Si alloy or Al—Si—Mg alloy. Other steps and parameters are the same as those in Embodiment V.

Embodiment VII: this embodiment differs from one of Embodiments I to VI in that a preparation method of the hollow glass microspheres with phosphors attached to the surfaces thereof is: mixing the hollow glass microspheres with a polyvinyl alcohol aqueous solution, adding a cross-linking agent ADH, stirring uniformly, then mixing with the phosphors and stirring, and drying to obtain the hollow glass microspheres with phosphors attached to the surfaces thereof. Other steps and parameters are the same as those in one of Embodiments I to VI.

Embodiment VIII: this embodiment differs from Embodiment VII in that the volume ratio of the hollow glass microspheres to the polyvinyl alcohol aqueous solution is 1:(0.04-0.05), the volume ratio of the hollow glass microspheres to the phosphors is 1:(0.01-0.02), and the mass fraction of polyvinyl alcohol in the polyvinyl alcohol aqueous solution is 9%-10%. Other steps and parameters are the same as those in Embodiment VII.

Embodiment IX: this embodiment differs from Embodiment VII or VIII in that the phosphor is a mixture of a yellow phosphor and a red phosphor, where the mass fraction of the yellow phosphor is 90%-9.15%. The difference is that the hollow glass microspheres have a particle size ranging from 20 μm to 30 μm and a wall thickness ranging from 1 μm to 2 μm. Other steps and parameters are the same as those in Embodiment VII or VIII.

Embodiment X: this embodiment differs from one of Embodiments VII to IX in that the phosphor is a mixture of a yellow phosphor and a red phosphor, where the mass fraction of the yellow phosphor is 90%-9.15%. Other steps and parameters are the same as those in one of Embodiments VII to IX.

The following examples are used to verify the beneficial effects of the present invention:

Example 1

A high-power remote phosphor white LED heat-dissipation package of this example includes a substrate (1), a chip (2), a heat conducting ring (3), a condenser lens (5), a support lens (6), and a phosphor structural layer (7).

An upper surface of the substrate (1) is provided with a cylindrical boss (11), the center of an upper surface of the boss (11) is provided with an inverted cone-shaped blind hole (12), and an inner wall of the blind hole (12) is a reflective surface; the heat conducting ring (3) is annular, and an annular protrusion (31) is provided on an upper surface of the heat conducting ring (3) near an inner circumferential surface; the outer circumferential diameter of the annular protrusion (31) decreases progressively from bottom to top, and the inner circumferential surface of the annular protrusion (31) is an inclined reflective surface; an annular groove (33) concentric with the annular protrusion (31) is disposed outside the annular protrusion (31) on the upper surface of the heat conducting ring (3); the chip (2) is mounted at the bottom of the inverted cone-shaped blind hole (12) in the substrate (1), the blind hole (12) is filled with a packaging adhesive (4), and the heat conducting ring (3) is sleeved on the boss (11) disposed on the upper surface of the substrate (1); the condenser lens (5) is a hemispherical lens, and a flat side of the condenser lens (5) faces towards the blind hole (12) and covers an opening of the blind hole (12); an upper surface of the condenser lens (5) between inclined reflective surfaces of the heat conducting ring (3) is coated with the phosphor structural layer (7); the support lens (6) is a hollow hemispherical lens, the support lens (6) is sleeved on the phosphor structural layer (7), and an opening of the support lens (6) is embedded inside the annular groove (33); and the phosphor structural layer (7) is formed by mixing hollow glass microspheres with phosphors attached to the surfaces thereof and silica gel, where the volume fraction of the hollow glass microspheres attached with phosphors is 65%.

The reflective surface of the inner wall of the blind hole (12) and the inclined reflective surfaces of the annular protrusion (31) in the heat conducting ring (3) are obtained by polishing, the packaging adhesive (4) is silica gel, the substrate (1) is an MCPCB aluminum substrate, and the material of the heat conducting ring (3) is pure copper; a preparation method of the hollow glass microspheres with phosphors attached to the surfaces thereof is: mixing the hollow glass microspheres with a polyvinyl alcohol aqueous solution, adding a crosslinking agent ADH, stirring uniformly, then mixing with the phosphors and stirring, and drying to obtain the hollow glass microspheres with phosphors attached to the surfaces thereof; the volume ratio of the hollow glass microspheres to the polyvinyl alcohol aqueous solution is 1:0.04, the volume ratio of the hollow glass microspheres to the phosphors is 1:0.02, the mass fraction of polyvinyl alcohol in the polyvinyl alcohol aqueous solution is 10%, the hollow glass microspheres have a particle size of 30 μm and a wall thickness of 1 μm; and the phosphor is a mixture of a yellow phosphor and a red phosphor, where the mass fraction of the yellow phosphor is 90%.

The luminous flux, color temperature, and color rendering index are measured by using a photometric integrating sphere, the test current is 120 mA, and after 10 h, the LED junction temperature is measured by using a voltage method at room temperature (25° C.) to be 75° C., and the temperature at the bared part of the heat conducting ring (3) is measured to be 35° C. by using a thermal infrared imager, indicating that the heat of the phosphor structural layer (7) is effectively derived. In this embodiment, output of the white light output of the high-power remote phosphor white LED heat-dissipation package is stable, and the luminous flux does not change substantially, the color rendering index reaches 88, and the color temperature is 3,800 K after continuously illuminating for 1,200 h.

Example 2

A high-power remote phosphor white LED heat-dissipation package of this example includes a substrate (1), a chip (2), a heat conducting ring (3), a condenser lens (5), a support lens (6), and a phosphor structural layer (7).

An upper surface of the substrate (1) is provided with a cylindrical boss (11), the center of an upper surface of the boss (11) is provided with an inverted cone-shaped blind hole (12), and an inner wall of the blind hole (12) is a reflective surface; the heat conducting ring (3) is annular, and an annular protrusion (31) is provided on an upper surface of the heat conducting ring (3) near an inner circumferential surface; the outer circumferential diameter of the annular protrusion (31) decreases progressively from bottom to top, and the inner circumferential surface of the annular protrusion (31) is an inclined reflective surface; an annular groove (33) concentric with the annular protrusion (31) is disposed outside the annular protrusion (31) on the upper surface of the heat conducting ring (3); the chip (2) is mounted at the bottom of the inverted cone-shaped blind hole (12) in the substrate (1), the blind hole (12) is filled with a packaging adhesive (4), and the heat conducting ring (3) is sleeved on the boss (11) disposed on the upper surface of the substrate (1); the condenser lens (5) is a hemispherical lens, and a flat side of the condenser lens (5) faces towards the blind hole (12) and covers an opening of the blind hole (12); an upper surface of the condenser lens (5) between inclined reflective surfaces of the heat conducting ring (3) is coated with the phosphor structural layer (7); the support lens (6) is a hollow hemispherical lens, the support lens (6) is sleeved on the phosphor structural layer (7), and an opening of the support lens (6) is embedded inside the annular groove (33); and the phosphor structural layer (7) is formed by mixing hollow glass microspheres with phosphors attached to the surfaces thereof and silica gel, where the volume fraction of the hollow glass microspheres attached with phosphors is 65%.

The reflective surface of the inner wall of the blind hole (12) and the inclined reflective surfaces of the annular protrusion (31) in the heat conducting ring (3) are coated with a silver layer, the substrate (1) is an MCPCB aluminum substrate, the material of the heat conducting ring (3) is Al—Si—Mg alloy, and the packaging adhesive (4) is silica gel; a preparation method of the hollow glass microspheres with phosphors attached to the surfaces thereof is: mixing the hollow glass microspheres with a polyvinyl alcohol aqueous solution, adding a crosslinking agent ADH, stirring uniformly, then mixing with the phosphors and stirring, and drying to obtain the hollow glass microspheres with phosphors attached to the surfaces thereof; the volume ratio of the hollow glass microspheres to the polyvinyl alcohol aqueous solution is 1:0.05, the volume ratio of the hollow glass microspheres to the phosphors is 1:0.01, the mass fraction of polyvinyl alcohol in the polyvinyl alcohol aqueous solution is 9.5%, the hollow glass microspheres have a particle size of 20 μm and a wall thickness of 1.5 μm; and the phosphor is a mixture of a yellow phosphor and a red phosphor, where the mass fraction of the yellow phosphor is 91%.

The luminous flux, color temperature, and color rendering index are measured by using a photometric integrating sphere, the test current is 120 mA, and after 10 h, the LED junction temperature is measured by a voltage method at room temperature (25° C.) to be 73° C., and the temperature at the bared part of the heat conducting ring (3) is measured to be 33° C. by an thermal infrared imager, indicating that the heat of the phosphor structural layer (7) is effectively derived. In this embodiment, the white light output of the high-power remote phosphor white LED heat-dissipation package is stable, and the luminous flux does not change substantially, the color rendering index reaches 85, and the color temperature is 4,000 K after continuously illuminating for 1,200 h.

What is claimed is:

1. A high-power remote phosphor white LED heat-dissipation package, wherein the structure comprises a substrate (1), a chip (2), a heat conducting ring (3), a condenser lens (5), a support lens (6), and a phosphor structural layer (7);

an upper surface of the substrate (1) is provided with a cylindrical boss (11), the center of an upper surface of the boss (11) is provided with an inverted cone-shaped blind hole (12), and an inner wall of the blind hole (12) is a reflective surface; the heat conducting ring (3) is annular, and an annular protrusion (31) is provided on an upper surface of the heat conducting ring (3) near an inner circumferential surface; the outer circumferential diameter of the annular protrusion (31) decreases progressively from bottom to top, and the inner circumferential surface of the annular protrusion (31) is an inclined reflective surface; an annular groove (33) concentric with the annular protrusion (31) is disposed outside the annular protrusion (31) on the upper surface of the heat conducting ring (3); the chip (2) is mounted at the bottom of the inverted cone-shaped blind hole (12) in the substrate (1), the blind hole (12) is filled with a packaging adhesive (4), and the heat conducting ring (3) is sleeved on the boss (11) disposed on the upper surface of the substrate (1); the condenser lens (5) is a hemispherical lens, and a flat side of the condenser lens (5) faces towards the blind hole (12) and covers an opening of the blind hole (12); an upper surface of the condenser lens (5) between inclined reflective surfaces of the heat conducting ring (3) is coated with the phosphor structural layer (7); and the support lens (6) is a hollow hemispherical lens, the support lens (6) is sleeved on the phosphor structural layer (7), and an opening of the support lens (6) is embedded inside the annular groove (33); and the phosphor structural layer (7) is formed by mixing hollow glass microspheres with phosphors attached to the surfaces thereof and silica gel, wherein the volume fraction of the hollow glass microspheres attached with phosphors is 60%-65%.

2. The high-power remote phosphor white LED heat-dissipation package according to claim 1, wherein the reflective surface of the inner wall of the blind hole (12) and the inclined reflective surfaces of the annular protrusion (31) in the heat conducting ring (3) are obtained by polishing or coating a reflective coating, or the reflective surface of the inner wall of the blind hole (12) and the inclined reflective surfaces of the annular protrusion (31) in the heat conducting ring (3) are coated with a nickel layer or a silver layer.

3. The high-power remote phosphor white LED heat-dissipation package according to claim 1, wherein the packaging adhesive (4) is silica gel.

4. The high-power remote phosphor white LED heat-dissipation package according to claim 1, wherein the substrate (1) is an MCPCB aluminum substrate.

5. The high-power remote phosphor white LED heat-dissipation package according to claim 1, wherein the material of the heat conducting ring (3) is pure copper or aluminum alloy.

6. The high-power remote phosphor white LED heat-dissipation package according to claim 5, wherein the aluminum alloy is Al—Si alloy or Al—Si—Mg alloy.

7. The high-power remote phosphor white LED heat-dissipation package according to claim 1, wherein a preparation method of the hollow glass microspheres with phosphors attached to the surfaces thereof is: mixing the hollow glass microspheres with a polyvinyl alcohol aqueous solution, adding a crosslinking agent ADH, stirring uniformly, then mixing with the phosphors and stirring, and drying to obtain the hollow glass microspheres with phosphors attached to the surfaces thereof.

8. The high-power remote phosphor white LED heat-dissipation package according to claim 7, wherein the volume ratio of the hollow glass microspheres to the polyvinyl alcohol aqueous solution is 1:(0.04-0.05), the volume ratio of the hollow glass microspheres to the phosphors is 1:(0.01-0.02), and the mass fraction of polyvinyl alcohol in the polyvinyl alcohol aqueous solution is 9%-10%.

9. The high-power remote phosphor white LED heat-dissipation package according to claim 7, wherein the hollow glass microspheres have a particle size ranging from 2 μm to 30 μm and a wall thickness ranging from 1 μm to 2 μm.

10. The high-power remote phosphor white LED heat-dissipation package according to claim 7, wherein the phosphor is a mixture of a yellow phosphor and a red phosphor, wherein the mass fraction of the yellow phosphor is 90%-91.5%.

* * * * *